United States Patent
Steinberger et al.

(10) Patent No.: US 12,424,357 B2
(45) Date of Patent: Sep. 23, 2025

(54) PTC HEATER WITH REDUCED SWITCH-ON CURRENT

(71) Applicant: TDK Electronics AG, Munich (DE)

(72) Inventors: Bernhard Steinberger, Graz (AT); Jiri Brezina, Bludov (CZ); Michal Geprt, Bludov (CZ); Zdenek Sita, Lanskroun (CZ)

(73) Assignee: TDK Electronics AG, Munich (DE)

( * ) Notice: Subject to any disclaimer, the term of this patent is extended or adjusted under 35 U.S.C. 154(b) by 99 days.

(21) Appl. No.: 16/479,191

(22) PCT Filed: Dec. 19, 2017

(86) PCT No.: PCT/EP2017/083598
§ 371 (c)(1),
(2) Date: Jul. 18, 2019

(87) PCT Pub. No.: WO2018/141458
PCT Pub. Date: Aug. 9, 2018

(65) Prior Publication Data
US 2019/0385768 A1    Dec. 19, 2019

(30) Foreign Application Priority Data
Feb. 1, 2017 (DE) .................... 10 2017 101 946.4

(51) Int. Cl.
*H01C 7/02* (2006.01)
*H01C 1/14* (2006.01)
(Continued)

(52) U.S. Cl.
CPC .......... *H01C 7/025* (2013.01); *H01C 1/1406* (2013.01); *H05B 3/03* (2013.01); *H05B 3/141* (2013.01); *H05B 2203/02* (2013.01)

(58) Field of Classification Search
CPC .......... H01C 7/02; H01C 7/023; H01C 7/025; H01C 1/1406; H05B 3/03; H05B 3/141; H05B 3/12; H05B 2203/02
See application file for complete search history.

(56) References Cited

U.S. PATENT DOCUMENTS 3,027,529 A    3/1962 Schöfer et al.
3,495,120 A    2/1970 Knippenberg et al.
(Continued)

FOREIGN PATENT DOCUMENTS

CN    102883478 A    1/2013
CN    205812414 U    12/2016
(Continued)

OTHER PUBLICATIONS

Cahill, D. et al., "Thermal conductivity of k-Al2O3 and a-Al2O3 wear-resistant coatings", ResearchGate, Journal of applied physics, Jun. 1998, 6 pages.
(Continued)

*Primary Examiner* — Elizabeth M Kerr
(74) *Attorney, Agent, or Firm* — Slater Matsil, LLP

(57) ABSTRACT

A positive temperature coefficient (PTC) heater is disclosed. In an embodiment the PTC heater includes a main body having a length L, a width B, and a height H made of a PTC material and a first electrode and a second electrode made of an electrically conductive material, wherein the following is true for L, B, and H: L≥B≥H, and wherein the electrodes are connected to the main body so that the following is true for a spacing d thereof from one another: d>H.

18 Claims, 3 Drawing Sheets

(51) Int. Cl.
*H05B 3/03* (2006.01)
*H05B 3/14* (2006.01)

(56) References Cited

U.S. PATENT DOCUMENTS

| | | | |
|---|---|---|---|
| 4,210,800 A * | 7/1980 | Van Bokestal | H01C 1/028 |
| | | | 219/544 |
| 4,766,409 A * | 8/1988 | Mandai | H01C 7/021 |
| | | | 338/25 |
| 4,801,785 A * | 1/1989 | Chan | H05B 3/146 |
| | | | 219/541 |
| 5,057,674 A * | 10/1991 | Smith-Johannsen | H05B 3/146 |
| | | | 219/505 |
| 5,210,516 A | 5/1993 | Shikama et al. | |
| 5,451,747 A * | 9/1995 | Sullivan | A61F 7/007 |
| | | | 219/505 |
| 5,592,647 A * | 1/1997 | Yamauchi | H05B 3/14 |
| | | | 392/432 |
| 5,602,520 A * | 2/1997 | Baiatu | H01C 7/13 |
| | | | 338/22 SD |
| 5,804,797 A * | 9/1998 | Kaimoto | H01C 7/02 |
| | | | 219/505 |
| 5,922,233 A | 7/1999 | Ohashi et al. | |
| 6,441,717 B1 * | 8/2002 | Ikeda | H01C 1/1406 |
| | | | 338/332 |
| 7,335,855 B2 | 2/2008 | von der Lühe et al. | |
| 8,289,125 B2 | 10/2012 | Kishimoto et al. | |
| 8,698,051 B2 | 4/2014 | Twiney et al. | |
| 9,472,326 B2 | 10/2016 | Shimura et al. | |
| 9,697,935 B2 | 7/2017 | Itoh et al. | |
| 2002/0105022 A1 | 8/2002 | Kawamoto et al. | |
| 2003/0030192 A1 * | 2/2003 | Niimi | H01C 17/06533 |
| | | | 264/618 |
| 2006/0076343 A1 * | 4/2006 | Lin | H05B 3/26 |
| | | | 219/543 |
| 2012/0175362 A1 * | 7/2012 | Mikkelsen | H05B 3/34 |
| | | | 219/553 |
| 2013/0001218 A1 | 1/2013 | Ihle et al. | |
| 2014/0049357 A1 * | 2/2014 | Tseng | H01C 7/02 |
| | | | 338/22 R |
| 2014/0091896 A1 * | 4/2014 | Wang | H01C 1/1406 |
| | | | 338/22 R |
| 2014/0205336 A1 * | 7/2014 | Chu | H01C 7/041 |
| | | | 219/541 |
| 2014/0247107 A1 | 9/2014 | Aoto et al. | |
| 2014/0327513 A1 * | 11/2014 | Yang | C08K 3/14 |
| | | | 252/519.21 |
| 2015/0097650 A1 * | 4/2015 | Shimura | H01C 7/008 |
| | | | 252/519.12 |
| 2016/0338149 A1 | 11/2016 | Sweeney et al. | |
| 2018/0156493 A1 * | 6/2018 | Bohlender | F24H 9/2028 |

FOREIGN PATENT DOCUMENTS

| | | |
|---|---|---|
| DE | 1415430 A1 | 3/1969 |
| DE | 1639354 A1 | 6/1970 |
| DE | 1913960 A1 | 2/1971 |
| DE | 69114322 T2 | 6/1996 |
| DE | 10060942 A1 | 6/2001 |
| DE | 69532131 T2 | 8/2004 |
| DE | 102010004051 A1 | 7/2011 |
| DE | 102011000904 A1 | 8/2012 |
| DE | 102011081833 A1 | 2/2013 |
| DE | 112012004578 T5 | 8/2014 |
| DE | 102015107322 A1 | 11/2016 |
| DE | 112014001227 B4 | 10/2019 |
| EP | 0437239 A2 | 7/1991 |
| EP | 1657963 A1 | 5/2006 |
| EP | 2377836 A1 | 10/2011 |
| EP | 2966050 A1 | 1/2016 |
| GB | 1222887 A | 2/1971 |
| JP | S5895603 U | 6/1983 |
| JP | S58100388 A | 6/1983 |
| JP | S63146402 A | 6/1988 |
| JP | H05291002 A | 11/1993 |
| JP | H0547444 Y2 | 12/1993 |
| JP | H06275370 A | 9/1994 |
| JP | H0722159 A | 1/1995 |
| JP | 794260 A | 4/1995 |
| JP | H0794260 A | 4/1995 |
| JP | H07161503 A | 6/1995 |
| JP | H07211511 A | 8/1995 |
| JP | H11297504 A | 10/1999 |
| WO | 2012111385 A1 | 8/2012 |

OTHER PUBLICATIONS

Li, L. et al., "Thermal stabilities and the thermal degradation kinetics of polyimides" Polymer Degradation and Stability, Nov. 1, 2003, 5 pages.

Regnier, N. et al., "Methodology for multistage degradation of polyimide polymer", Polymer degradation and stability, Mar. 28, 1996, 8 pages.

Smith, D. et al., "Thermal resistance of grain boundaries in alumina ceramics and refractories", Journal of the American Ceramic Society, Oct. 23, 2002, 7 pages.

Suemune, Y., "Thermal conductivity of BaTiO3 and SrTiO3 from 4.5 to 300 K", Applied Physics Express, Nov. 7, 1964, 2 pages.

Tachibana, M. et al., "High-temperature thermal conductivity of ferroelectric and antiferroelectric perovskites", Applied Physics Express, 6 pages.

Yokoyama, H., "Thermal conductivity of polyimide film at cryogenic temperature", Cryogenics, Nov. 1995, 2 pages.

Google, "Air Dielectric," Dec. 18, 2024, 5 pages.

Google, "Lateral Surface," Dec. 18, 2024, 5 pages.

* cited by examiner

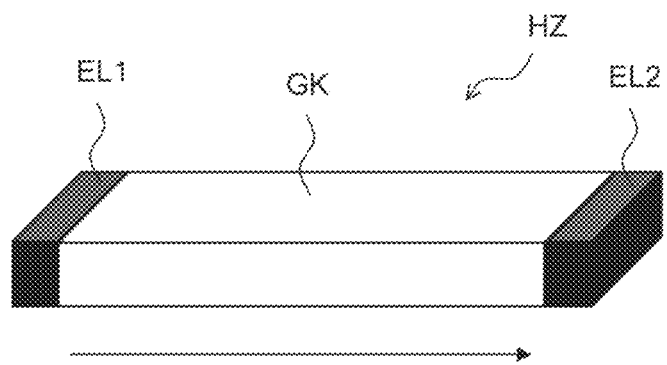
Fig. 1
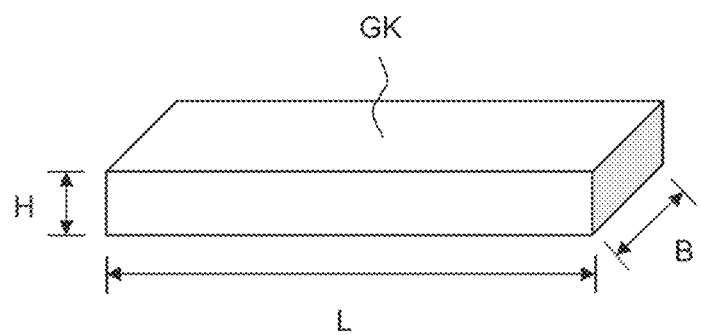
Fig. 2
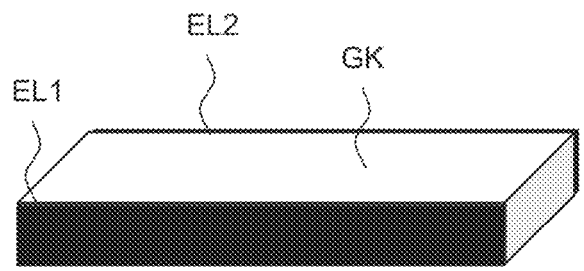
Fig. 3
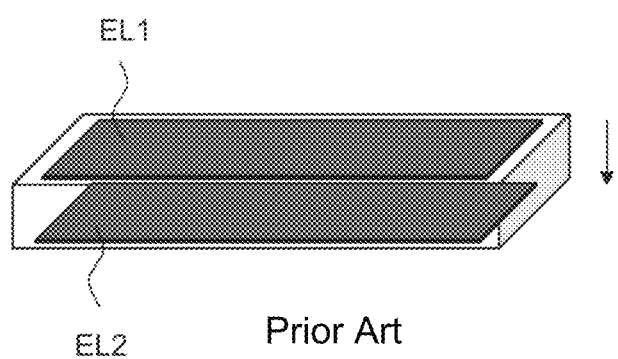
Prior Art    Fig. 4

PTC HEATER WITH REDUCED SWITCH-ON CURRENT

This patent application is a national phase filing under section 371 of PCT/EP2017/083598, filed Dec. 19, 2017, which claims the priority of German patent application 102017101946.4, filed Feb. 1, 2017, each of which is incorporated herein by reference in its entirety.

TECHNICAL FIELD

The invention relates to PTC heaters, in which the switch-on current is reduced.

BACKGROUND

PTC heaters have a wall element made of a PTC material (PTC=Positive Temperature Coefficient), i.e., the electrical resistance of the PTC material increases with rising temperature. Such heaters can be used for converting electrical energy into thermal energy.

In known PTC heaters, the PTC material is contained in a relatively thin layer. The thin layer is arranged between two electrodes. An electrical current which flows from one electrode through the PTC material to the other electrode deposits energy in the PTC material, which is converted into heat. Typically, at least one of the electrodes is simultaneously a coupling element in this case, using which the PTC material is thermally coupled to its surroundings. This electrode is thus used for discharging the resulting heat to the surroundings. The spacing between the electrodes is as small as possible in this case, so that with a predetermined volume of PTC material, the surface of the electrode and thus the surface via which energy is emitted to the surroundings is relatively large. The thermal resistance of the heater is low due to the low thickness of the PTC material.

However, such PTC heaters are distinguished by a relatively high switch-on current and, accompanying this, by a relatively low breakdown voltage. These electrical parameters are moreover very strongly dependent on variations of the processes during the production of the heater. A relatively high production expenditure accordingly has to be made to keep the discard rate as low as possible during the production of the heaters.

SUMMARY OF THE INVENTION

Embodiments provide PTC heaters in which the switch-on current is reduced, the breakdown voltage is increased, and the dependence of the quality of the heaters on variations of parameters during the production is reduced.

In various embodiments the PTC heater has a main body having a length L, a width B, and a height H. The main body consists of a PTC material, i.e., of a material having a positive temperature coefficient. The specific resistance of the PTC material increases with rising temperature. Furthermore, the PTC heater has a first electrode and a second electrode. The two electrodes consist of an electrically conductive material. The following applies for the length, the width, and the height: L≥B≥H. This means, with respect to a main body having a specific shape, the directions in which length, width, and height are measured are oriented in relation to one another so that the width≥the height. The length is ≥ the width. The length is the greatest possible spacing between two points of the main body in this case. The electrodes are connected at the main body so that the following applies for the spacing d thereof: d>H.

This means a PTC heater is specified in which the electrodes have a spacing from one another which is greater than the height of the heater. Of the three dimensions length, width, height, the height has the smallest value. With respect to a flat main body, the height of the main body thus essentially represents its thickness. The fact that the spacing of the electrodes differs from the thickness of the main body is thus equivalent to the fact that the electrodes are in particular not arranged on the opposing "large-area flat" sides of the heater.

While in known PTC heaters, the shape of the main body and the position of the electrodes are selected so that the electrical current covers the shortest possible path through the main body, it is now required for the electrodes to be arranged so that the electrical current covers a further path. The PTC material of the PTC heater can be a varistor material having a significant varistor effect. The specific resistance is then dependent on the applied voltage. Such materials can also be used in conventional PTC heaters. Sintered ceramic compositions can be contained in such materials. The total electrical resistance of the PTC material corresponds to the total of the resistance which is to be assigned to the volume of the sintered composition and the proportion of the resistance which is to be assigned to the grain boundaries of the sintered ceramic composition. Electrical potential barriers form at the grain boundaries, which keep the charge carriers of the current, for example, free electrons, from diffusing into adjacent regions. These potential barriers have to be formed correspondingly tall for PTC heaters having relatively high operating voltage. The proportion of the total resistance which is to be attributed to the grain boundaries thus rises. Such PTC heaters have a significantly pronounced dependence of the resistance on the applied voltage. If a high operating voltage is then applied—in particular during the switch-on procedure—the height of the potential barriers thus decreases because of the varistor effect and the resistance of the heater decreases significantly. At the same time, the temperature of the heater is still relatively low. As a result, the switch-on current is very high. A high switch-on current has negative effects on electrical or electronic circuit components in the circuitry environment of the heater.

Nonlinear behavior increases with increasing voltage and/or increasing electrical field strength. Nonlinear effects are reduced by an enlargement of the spacing of the electrodes and, accompanying this, by a reduction of the electrical field strength in the interior of the varistor material at constant voltage. In contrast to conventional PTC heaters, fluctuations of the resistance are reduced by the displacement of the position of the electrodes. Variations of the total conductivity of the component are accordingly reduced. The dependence of the resistance of the PTC material on fluctuations or variations during the production, on the one hand, and thus the discard rate of PTC heaters which do not meet required specifications, on the other hand, are accordingly reduced.

Because the electrodes of the heater are not located on the large surfaces lying close to one another of a flatly formed main body, but rather the electrodes are located at the more remote ends of the main body, the switch-on current is reduced, in particular if the same total resistance of the heater is maintained. The breakdown voltage is elevated and the sensitivity with respect to variations during the production is reduced. The fact that at predetermined electrical voltage, the strength of the electrical field is reciprocal to the spacing of the electrodes also contributes thereto. The electrical field in the material of the PTC heater is reduced, which also reduces nonlinear effects, for example, at grain boundaries.

It is possible that the following applies for the length, the width, and the height: L B>H, i.e., the width is actually greater than the height.

It is possible that the main body has the shape of a cuboid, a cylinder, a film, or an ellipsoid. If the main body has the shape of a cuboid, for example, a very flat cuboid, the opposing surfaces having the shortest spacing can thus certainly be used to dissipate the heat. However, these lateral surfaces of the cuboid are in particular not the ones via which the current is substantially supplied.

The main body can even be formed so flat that it practically represents a film. In this case, the current does not, however, flow along the thickness direction through the film, but rather more or less from one end of the film to another end, but not from one side of the film to the other, closely adjacent side of the film.

It is possible that the main body comprises doped $BaTiO_3$ (barium titanate). Barium titanate represents the starting material of the PTC material of the heater in this case. The barium titanate can comprise additional elements such as strontium, lead, and/or calcium. The Curie temperature of the material can be reduced by adding strontium. The Curie temperature can be elevated by adding lead.

Furthermore, the starting material of the PTC material can be optimized by adding rare earth elements, for example, scandium, yttrium, lanthanum, cerium, praseodymium, neodymium, promethium, samarium, europium, gadolinium, terbium, dysprosium, holmium, erbium, thulium, ytterbium, and/or lutetium, on the one hand, and/or by adding manganese, iron, or aluminum, on the other hand. The starting resistance at room temperature can be set by adding these elements.

It is possible that the length of the PTC heater and/or of the main body is 2.5 cm or 3.5 cm or more. The maximum length can be 5 cm or less. The PTC heater or the main body can have a width of 1 cm or more and a width of 4 cm or less. The height can be 100 μm or more. Heights of 4 mm or 5 mm are possible.

It is possible that the PTC heater comprises a carrier. The main body is arranged on the carrier.

In particular if the main body is embodied as a thin film, the carrier is used to give the PTC heater a stable shape. Moreover, the carrier can also help to emit energy dissipated in the main body to the surroundings It is possible that the electrodes comprise chromium, nickel, titanium, aluminum, silver, copper, and/or gold.

It is preferable for the electrodes to have the lowest possible electrical resistance.

The electrodes can be designed as clamp electrodes and can be clamped on the main body at the corresponding ends.

It is possible that the main body comprises a dielectric layer on one or more lateral surfaces.

The dielectric layer is electrically insulating and necessary because of the design deviating from conventional heaters, if dissipated heat is to be emitted via the large-area lateral surfaces, on which the electrodes are attached in conventional heaters.

The dielectric layer can have an oxidic ceramic, for example, based on an aluminum oxide, for example, $Al_2O_3$, chromium oxides, or nickel oxides.

The PTC heater can comprise a cooling element. The cooling element can be connected to the main body. The cooling element is provided to emit heat dissipated in the main body to the surroundings.

In conventional PTC heaters, the PTC material is the element which prevents a direct short circuit between the electrodes. Charge carriers on the way thereof from one electrode to the other electrode have to penetrate the—thin—main body and deposit energy in the main body at the same time.

If the electrodes are then located on the longitudinal-side ends of the main body and one or more cooling elements made of metal are arranged on the flanks of the main body, a cooling element can thus represent a current path preferred by charge carriers from one electrode to the other electrode, even if the cooling elements are not directly connected to the electrodes. Electrical current would then flow in a first section from one electrode through a part of the main body into one end of the cooling element. The current then passes the cooling element, but not the long path in the PTC material. At the other end of the cooling element, the current would then flow via a last segment of the main body to the second electrode.

In order that this does not take place, the dielectric layer is used as an insulation layer to galvanically separate the cooling element from the electrodes and from the main body interconnected with the electrodes.

BRIEF DESCRIPTION OF THE DRAWINGS

Central features of the present PTC heater, functional principles, and details of several nonrestrictive exemplary embodiments are explained in greater detail in the schematic figures.

In the figures:

FIG. 1 shows a perspective view of a heater;

FIG. 2 shows the meaning of the terms length, width, height;

FIG. 3 shows an alternative option for arranging the electrodes;

FIG. 4 shows a known heater having short current path;

DETAILED DESCRIPTION OF ILLUSTRATIVE EMBODIMENTS

FIG. 1 shows a fundamental design, in which the heater HZ has a main body GK, which is arranged between a first electrode EL1 and a second electrode EL2. The arrow indicates a possible direction of the electrical current in this case. The main body GK has the shape of a cuboid by way of example in FIG. 1. The electrodes are arranged in this case on ends of the main body which do not have the shortest spacing. The path of the electrical current is therefore relatively long. The electrical field strength is thus reduced in the main body and the number of the grain boundaries which the electrical current has to overcome is increased.

FIG. 2 shows the meaning of the terms length, width, and height with respect to a main body. In this case, the length is essentially the greatest-possible spacing of opposing ends, sections, or surfaces of the main body GK. The height is a measure of the shortest-possible spacing of opposing surfaces, sides, ends, or sections of the main body.

The shape of the main body is not restricted to cuboids or cuboid-like shapes. All possible shapes to which a length, a width, and a height may be assigned in accordance with the relationship L≥B≥H are possible.

FIG. 3 shows the possibility of arranging the two electrodes so that the main body is arranged in between, without the electrodes having the longest-possible spacing from one another. However, it is to be noted that the electrodes in particular do not have the shortest-possible spacing from one another, to avoid the above-mentioned disadvantages of known PTC heaters.

FIG. 4 shows in particular the typical geometry of a routine PTC heater. The electrodes EL1, EL2 are arranged in relation to the interposed main body so that the path which the electrical current has to take (arrow) is as short as possible. This is because in this case the electrodes themselves may be designed as large-area as possible and simultaneously may be used as a heat bridge for a well-functioning heat discharge to the surroundings.

Figure 5:
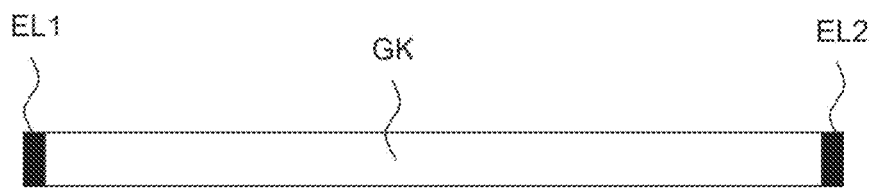
FIG. 5 shows a cross section through a heater.

FIG. 5 shows a possible shape of the electrodes EL1, EL2. The material of the electrodes covers the lateral surfaces facing away from one another of opposing ends of the main body GK in this case.

Figure 6:
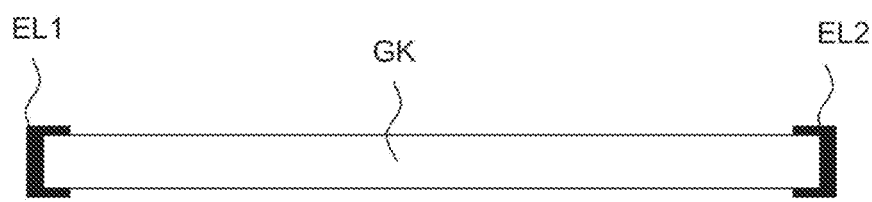
FIG. 6 shows a cross section through a heater having an alternative electrode shape.

FIG. 6 shows an alternative embodiment of the shape of the electrodes. They are not restricted to the opposing end faces. Rather, the electrodes also still extend a certain amount beyond the edges to the adjoining lateral surfaces of the respective electrode. If the electrodes are embodied as clamp electrodes, they may thus be connected relatively easily on the material of the main body GK and have a relatively stable mechanical contact at the same time. The electrical resistance is accordingly also low at the transition from the material of the electrodes to the material of the main body.

Figure 7:
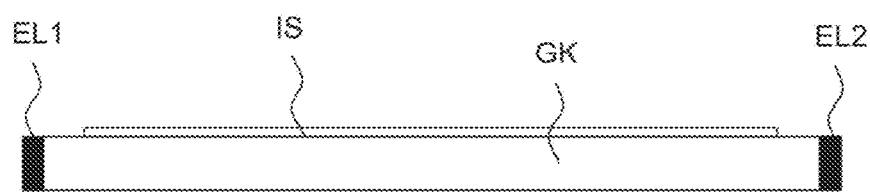
FIG. 7 shows a cross section through a heater having one insulation layer.

FIG. 7 shows the possibility of arranging a dielectric layer as insulation IS on at least one side of the main body.

Figure 8:
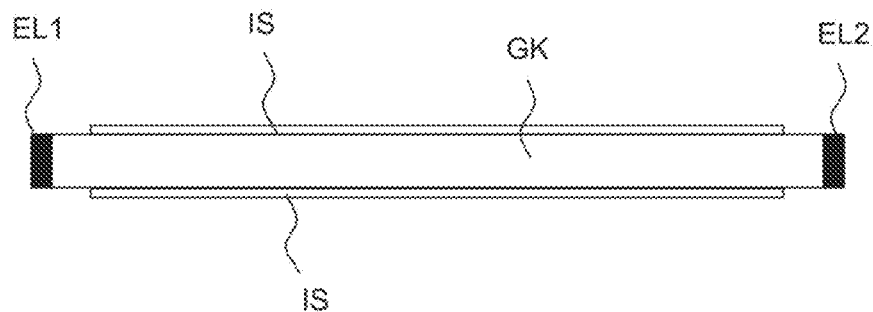
FIG. 8 shows a cross section through a heater having two insulation layers.

FIG. 8 shows that both opposing surfaces having the shortest possible spacing from one another can be covered by a separate insulation layer IS. The path from a point in the main body GK to the surroundings of the main body frequently leads in this case via the lateral surface on which the insulation layers are arranged, since these sides are in particular the sides which are formed large-area because of the low thickness. Accordingly, these surfaces may be used well to discharge dissipated heat.

In order that the electrical current from one electrode to the other electrode also actually takes the path through the main body GK and does not take a path of a lower electrical resistance via surroundings of the main body GK, the main body GK is insulated by the dielectric layer at least on the critical regions.

It can depend on the external surroundings of the main body and/or the PTC heater in this case as to whether an insulation layer is arranged now only on one side of the main body (as shown in FIG. 7) or on two sides of the main body (as shown in FIG. 8).

Figure 9:
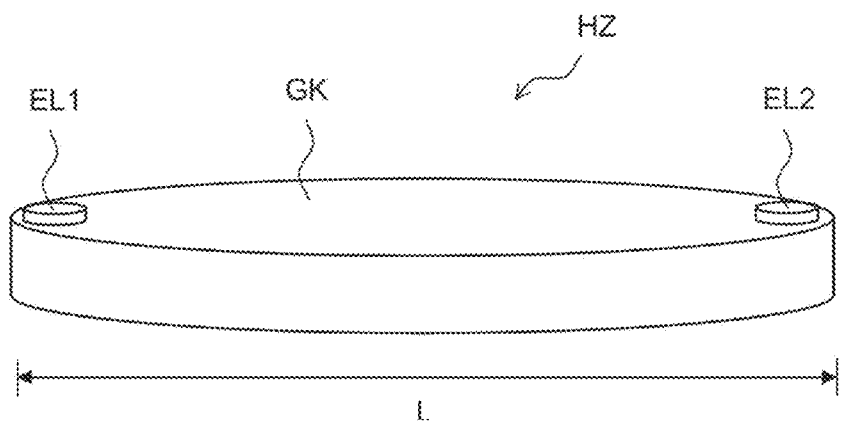
FIG. 9 shows the possibility of arranging electrodes on the same surface of the main body.

FIG. 9 shows, by way of example and in a perspective view, that the shape of the main body is not restricted to cuboids. Cylinders having a low height, i.e., round plates, but also other shapes such as plates having oval outlines, can be used.

Moreover, FIG. 9 additionally shows that the electrodes are to be arranged at the remote ends of the main body. Since the distance of electrodes is important, but not the side of the main body, both electrodes can also be arranged on the same side of the main body to arrive at the above-mentioned advantages of the presented PTC heater.

Figure 10:
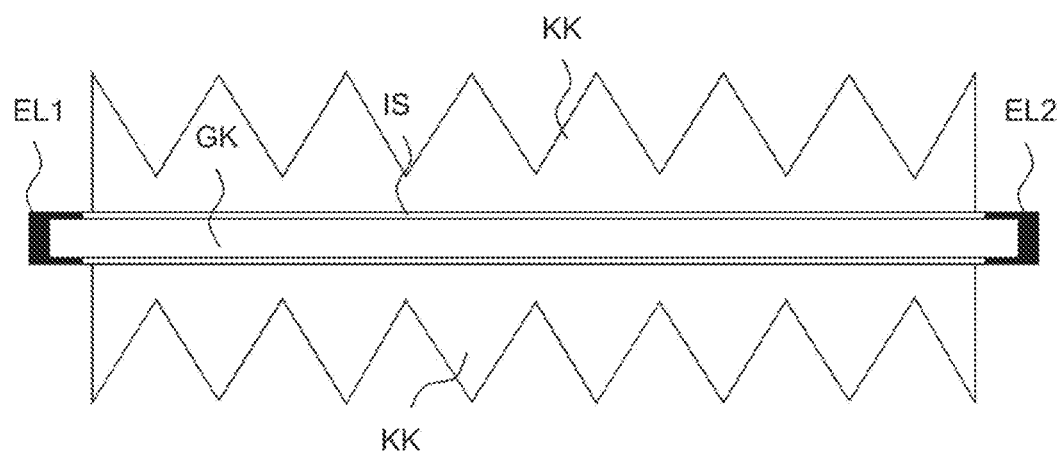
FIG. 10 shows the possibility of providing a cooling element for improved heat dissipation.

FIG. 10 shows the possibility of bringing a cooling element KK into thermal contact with the main body GK. In order that electrical current between the electrodes does not flow via the cooling element KK, it is preferably galvanically separated from the electrical system by a dielectric insulation layer IS. Cooling element and insulation layer can be arranged in this case on one, or also on both large-area sides of the PTC heater. The cooling element preferably has a large surface, for example, by means of cooling ribs, to keep the resistance of the heat flow low.

Figure 11:
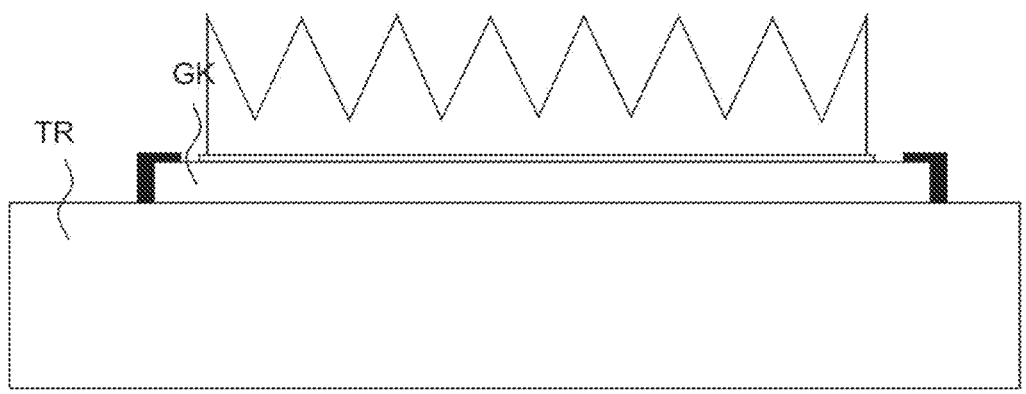
FIG. 11 shows the possibility of arranging the main body on a carrier.

FIG. 11 shows the possibility of arranging the main body on a carrier TR.

The described configuration of the main body enables the main body to be designed as a thin film. In order that sufficient mechanical stability is also maintained in thin films, the film can be arranged on the carrier TR and can be connected thereto. Heat can be emitted to the surroundings via the carrier TR, on the one hand, but also via a cooling element, on the other hand.

Additional cavities can be arranged in the carrier TR or in a cooling element KK, in which a liquid having high specific heat capacity, for example, cooling water, can flow to improve the heat emission and attain a higher thermal power range.

The thermal power range can be in this case between a few watts, for example, 2 W, and several hundred watts, for example, 300 W.

A typical electric power in this case is approximately 50 W, 100 W, 150 W, or 200 W.

Corresponding PTC heaters have an efficiency of nearly 100%.

The PTC heater is not restricted to the features mentioned or the exemplary embodiments shown. A heater can have additional circuit elements, feelers, thermal coupling elements, or the like.

The invention claimed is:

1. A positive temperature coefficient (PTC) heater comprising:
    a main body having a length L, a width B, and a height H made of a PTC material;
    a first electrode and a second electrode made of an electrically conductive material,
    wherein the following is true for L, B, and H: L≥B≥H,
    wherein the electrodes are connected to the main body so that the following is true for a spacing d thereof from one another: d>H; and
    a dielectric layer arranged on a lateral surface of the main body,
    wherein the main body has a shape of a cuboid,
    wherein the electrodes are arranged at opposing end surfaces of the main body,
    wherein the dielectric layer covers an area of the main body, which is free of the electrodes,
    wherein the dielectric layer is not arranged between the electrodes and the main body, and
    wherein the electrodes are arranged at the opposing end surfaces, the end surfaces having a distance of length L from each other.

2. The PTC heater according to claim 1, wherein H is 4 mm.

3. The PTC heater according to claim 1,
    wherein the main body comprises doped $BaTiO_3$,
    wherein the main body comprises Sr, Pb, and/or Ca, and wherein the main body comprises a rare earth element, Mn, Fe, and/or Al.

4. The PTC heater according to claim 1, wherein the following is true: L≥B>H.

5. The PTC heater according to claim 1, wherein the following is true:
2.5 cm≤L≤5 cm,
1 cm≤B≤4 cm, and
100 µm≤H.

6. The PTC heater according to claim 1, wherein the main body has a shape of a cylinder.

7. The PTC heater according to claim 1, wherein the main body has a shape of a film.

8. The PTC heater according to claim 1, wherein H is 5 mm.

9. The PTC heater according to claim 1, further comprising a carrier, wherein the main body is arranged on the carrier.

10. The PTC heater according to claim 1, further comprising a cooling element connected to the main body, wherein the cooling element is configured to emit heat dissipated in the main body to surroundings.

11. The PTC heater according to claim 1, wherein the dielectric layer comprises an oxidic ceramic.

12. The PTC heater according to claim 1, wherein the electrodes comprise Cr, Ni, Ti, Al, Ag, Cu, and/or Au.

13. A positive temperature coefficient (PTC) heater comprising:
a main body having a length L, a width B, and a height H made of a PTC material;
a first electrode and a second electrode made of an electrically conductive material,
wherein the following is true for L, B, and H: L≥B≥H,
wherein the electrodes are connected to the main body so that the following is true for a spacing d thereof from one another: d>H;
a dielectric layer arranged on a lateral surface of the main body; and
a carrier,
wherein the main body has a shape of a cuboid,
wherein the electrodes are arranged at opposing end surfaces of the main body,
wherein the dielectric layer covers an area of the main body, which is free of the electrodes,
wherein the dielectric layer is not arranged between the electrodes and the main body, and
wherein the main body and the electrodes are arranged on a top surface of the carrier.

14. The PTC heater according to claim 13, further comprising a cooling element connected to the main body, wherein the cooling element is configured to emit heat dissipated in the main body to surroundings.

15. The PTC heater according to claim 14, wherein the cooling element comprises cooling ribs.

16. The PTC heater according to claim 13, wherein the dielectric layer comprises an oxidic ceramic.

17. The PTC heater according to claim 13,
wherein the main body comprises doped $BaTiO_3$,
wherein the main body comprises Sr, Pb, and/or Ca, and
wherein the main body comprises a rare earth element, Mn, Fe, and/or Al.

18. The PTC heater according to claim 17, wherein the electrodes comprise Cr, Ni, Ti, Al, Ag, Cu, and/or Au.

* * * * *

UNITED STATES PATENT AND TRADEMARK OFFICE
CERTIFICATE OF CORRECTION

PATENT NO. : 12,424,357 B2  
APPLICATION NO. : 16/479191  
DATED : September 23, 2025  
INVENTOR(S) : Steinberger et al.

Page 1 of 1

It is certified that error appears in the above-identified patent and that said Letters Patent is hereby corrected as shown below:

In the Claims

In Column 7, in Claim 8, Line 14, delete "His" and insert -- H is --.

Signed and Sealed this  
Fourth Day of November, 2025

John A. Squires  
*Director of the United States Patent and Trademark Office*